US012772866B2

(12) United States Patent
Huang et al.

(10) Patent No.: US 12,772,866 B2
(45) Date of Patent: Oct. 20, 2026

(54) CHIP PACKAGING STRUCTURE AND METHOD FOR PACKAGING THE CHIP

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Zhi-Yong Huang, Shenzhen (CN); Yuan-Yu Lin, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 369 days.

(21) Appl. No.: 18/518,711

(22) Filed: Nov. 24, 2023

(65) Prior Publication Data

US 2024/0213036 A1 Jun. 27, 2024

Related U.S. Application Data

(63) Continuation-in-part of application No. PCT/CN2022/141604, filed on Dec. 23, 2022.

(51) Int. Cl.
*H10W 70/05* (2026.01)
*H10W 74/01* (2026.01)
*H10W 72/00* (2026.01)
*H10W 72/90* (2026.01)

(52) U.S. Cl.
CPC ....... *H10W 70/093* (2026.01); *H10W 74/019* (2026.01); *H10W 72/07236* (2026.01); *H10W 72/07237* (2026.01); *H10W 72/921* (2026.01); *H10W 72/923* (2026.01); *H10W 72/9415* (2026.01)

(58) Field of Classification Search
CPC ............ H10W 70/093; H10W 74/019; H10W 72/923; H10W 72/07236; H10W 72/07237; H10W 72/9415; H10W 72/921
See application file for complete search history.

(56) References Cited

U.S. PATENT DOCUMENTS

2012/0318855 A1* 12/2012 McLeod .................. B23K 1/20 228/203
2014/0178644 A1* 6/2014 Nystrom .............. H05K 3/0014 29/25.35
2016/0252688 A1* 9/2016 Barwicz ............... G02B 6/4232 385/14

FOREIGN PATENT DOCUMENTS

CN 106206464 A 12/2016
JP H10294337 A 11/1998
JP 2002016211 A * 1/2002

* cited by examiner

*Primary Examiner* — Mohammad M Choudhry
(74) *Attorney, Agent, or Firm* — ScienBiziP, P.C.

(57) ABSTRACT

A method for packaging a chip, the chip is packaged by disposing positioning post on the surface of the carrier, and the groove matching the positioning post is formed on the surface of the chip. During melting the first solder pastes and the second solder pastes, due to the interaction between the positioning post and the groove, the chip will not be deflected due to the tension of the first solder pastes and the second solder pastes, so that a chip packaging structure meets the expected requirements. The chip packaging structure is further provided in the present disclosure.

6 Claims, 10 Drawing Sheets

CHIP PACKAGING STRUCTURE AND METHOD FOR PACKAGING THE CHIP

FIELD

The subject matter herein generally relates to chip packaging, and more particularly, to a chip packaging structure and a method for packaging the chip.

BACKGROUND

During a chip packaging process, the chip may be deviated from a desired position, resulting in poor welding quality or welding gaps. A short circuit may also generate, causing the chip unusable. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
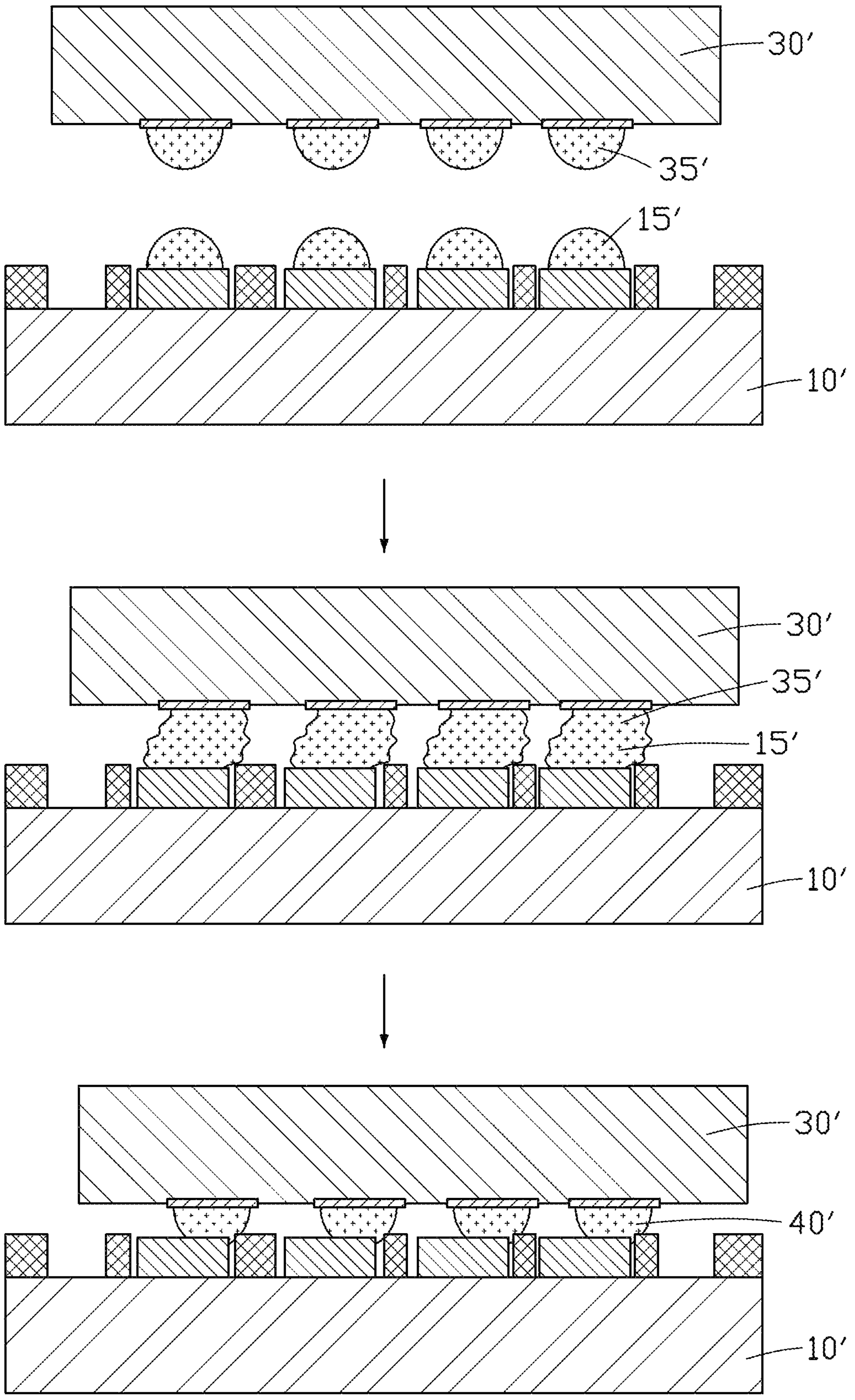
FIG. 1 shows a chip packaging process in a related art.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Referring to FIG. 1, a method for fixing a chip 30' on a carrier 10' is provided according to a related art. The method can begin at block 01.

In block 01, a plurality of first solder pastes 15' is formed on the carrier 10'.

In block 02, a plurality of second solder pastes 35' is formed on the chip 30'.

In block 03, the chip 30' is placed on the carrier 10', the second solder pastes 35' and the first solder pastes 15' are melted, so that the second solder pastes 35' and the first solder pastes 15' form solder balls 40' to connect the chip 30' and the carrier 10'.

When the first solder pastes 15' and the second solder pastes 35' are melted, a large tension occurs on the surfaces of the first solder pastes 15' and the second solder pastes 35'. The tension causes non-directional pulling force applied on the chip 30', causing the chip 30' to deviate from or tilt with respect to its original position, which may lead to unexpected connections or empty soldering of the solder balls 40', thereby forming defective products.

Figure 10:
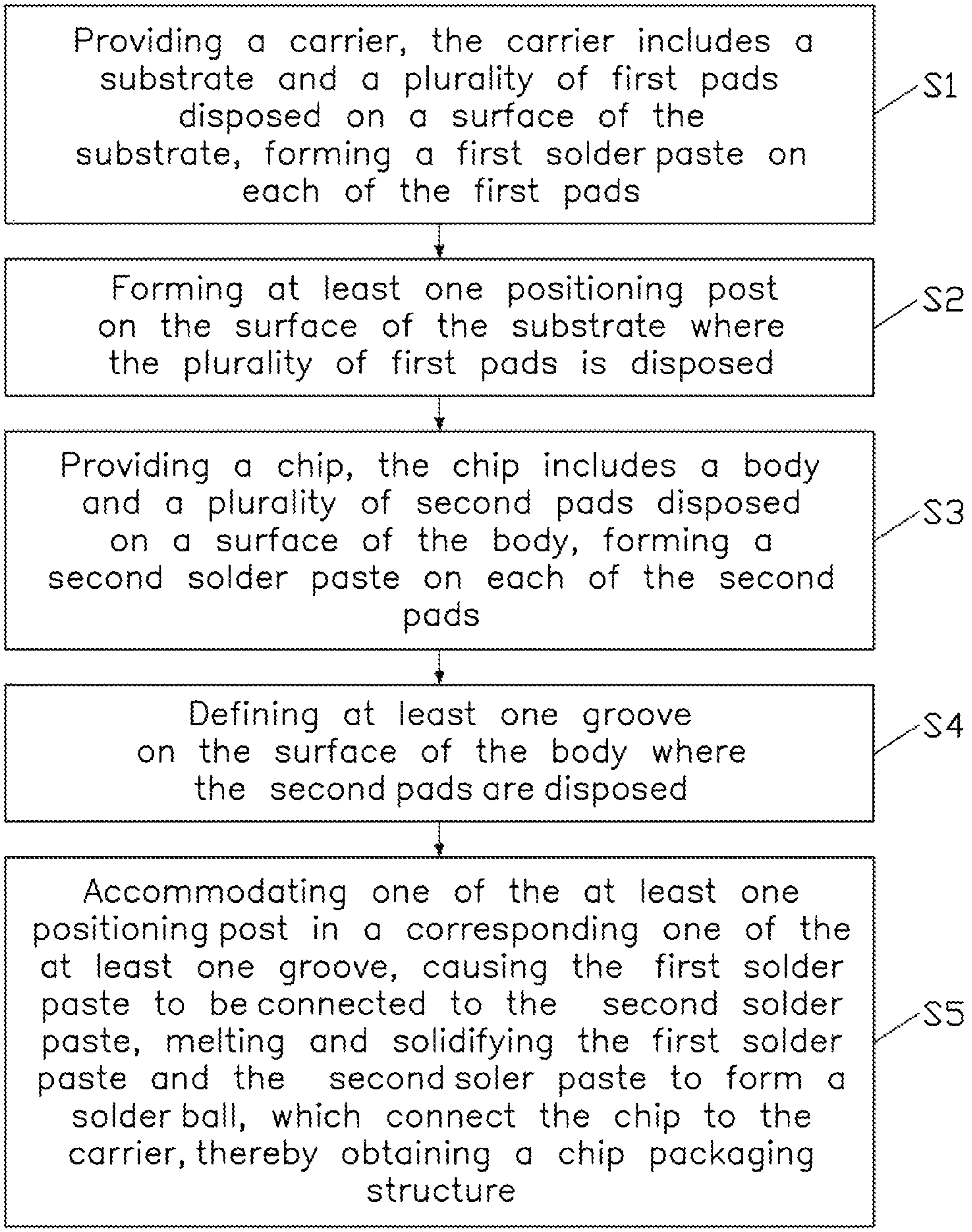
FIG. 10 is a flowchart of an embodiment of a method for packaging a chip according to the present disclosure.

Referring to FIG. 10, a method for packaging a chip 30 is provided according to an embodiment of the present disclosure. The method can begin at block 1.

Figure 2:
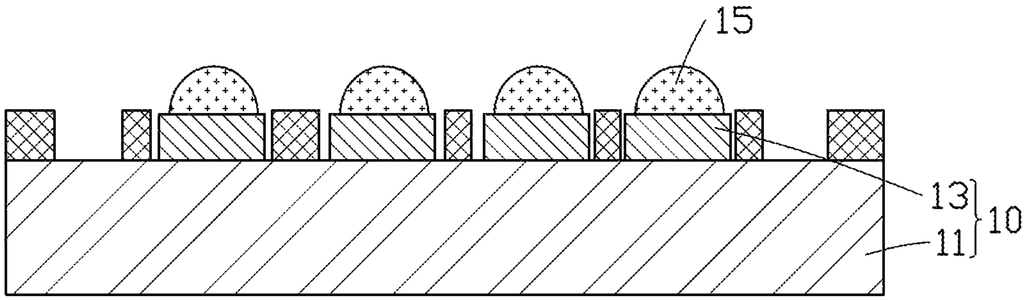
FIG. 2 is a cross-sectional view showing a first solder paste formed on each first pad of a carrier according to the present disclosure.

In block 1, referring to FIG. 2, a carrier 10 is provided. The carrier 10 includes a substrate 11 and a plurality of first pads 13 disposed on a surface of the substrate 11, and a first solder paste 15 is formed on each of the first pads 13.

The substrate 11 includes at least one circuit layer (not shown) and at least one dielectric layer (not shown).

The first pads 13 are electrically connected to the circuit layer. The first pads 13 can be disposed in a matrix, and two adjacent first pads 13 are spaced apart from each other. The first solder pastes 15 are disposed on an outer surface of the carrier 10. The first solder pastes 15 are disposed on surfaces of the first pads 13, and two adjacent first solder pastes 15 are spaced apart from each other.

In block 2, referring to FIGS. 3 to 6, at least one positioning post 20 is formed on a surface of the substrate 11 where the first pads 13 are disposed.

Forming the positioning post 20 on the carrier 10 can be carried out by steps shown in blocks 201 to 204.

Figure 3:
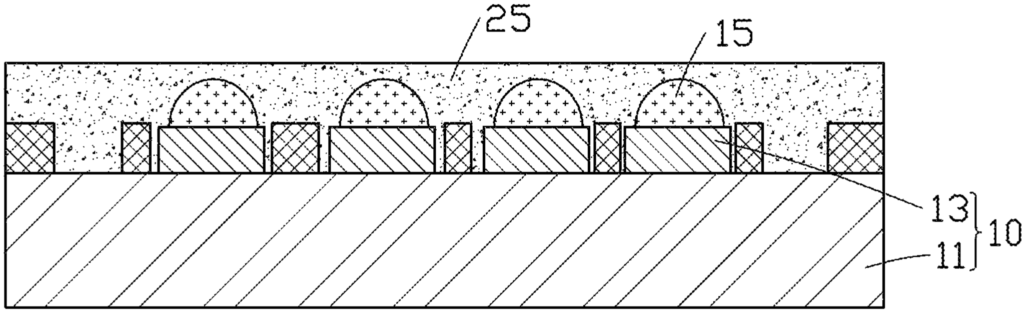
FIG. 3 is a cross-sectional view showing a dry film covering the carrier of FIG. 2.

In block 201, referring to FIG. 3, a dry film 25 covers the surface of the carrier 10 where the first pads 13 are disposed, and the dry film 25 further covers the first solder pastes 15.

Figure 4:
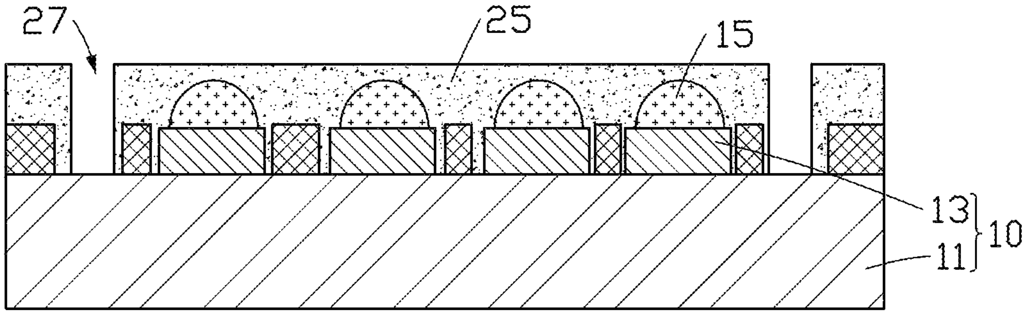
FIG. 4 is a cross-sectional view showing blind holes defined on the dry film of FIG. 3.

In block 202, referring to FIG. 4, the dry film 25 is subjected to an exposed and developed process to form at least one blind hole 27. Each blind hole 27 exposes partially surface of the substrate 11.

Figure 5:
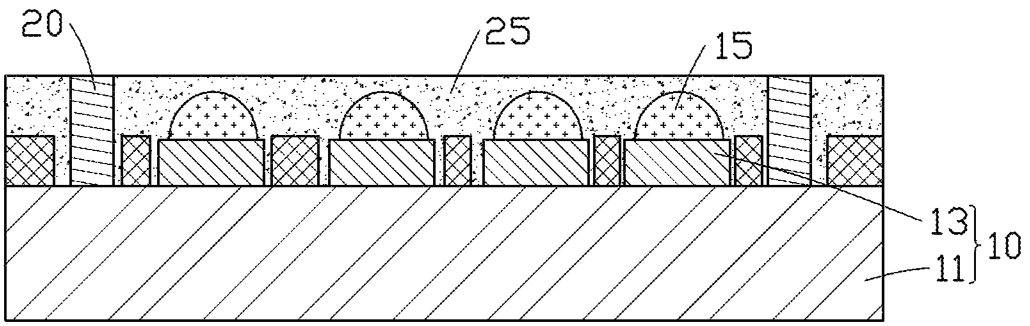
FIG. 5 is a cross-sectional view showing positioning posts formed in the blind holes of FIG. 4.

In block 203, referring to FIG. 5, the positioning post 20 is formed in the blind hole 27 to connect to the substrate 11. The positioning post 20 can be formed in the corresponding blind hole 27 by electroplating.

In some embodiments, when one blind hole 27 is formed, the blind hole 27 is a special shape, that is, the blind hole 27 is non-cylindrical. The positioning post 20 formed in the blind hole 27 is also non-cylindrical, which can prevent a chip 30 (referring to FIG. 7) from rotating and deflecting during the subsequent positioning process. In some embodiments, at least two blind holes 27 are formed. The blind holes 27 can be cylindrical or non-cylindrical, either of which can play a positioning role. In the embodiment, four blind holes 27 is formed, and the blind holes 27 are distributed at four corners of the carrier 10.

Figure 6:
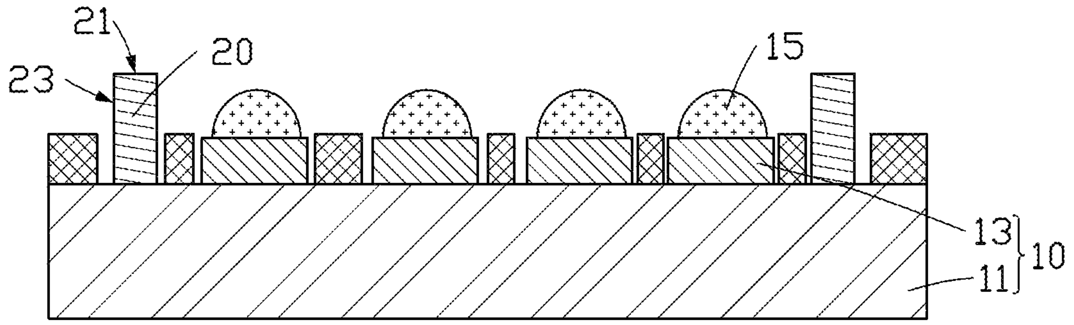
FIG. 6 is a cross-sectional view showing the dry film of FIG. 5 removed.

In block 204, referring to FIG. 6, the dry film 25 is removed to obtain the carrier 10 where the positioning post 20 is formed.

Each positioning post 20 includes a top surface 21 and a side surface 23. The top surface 21 is away from the substrate 11. The side surface 23 connects the top surface 21 and the substrate 11.

Figure 7:
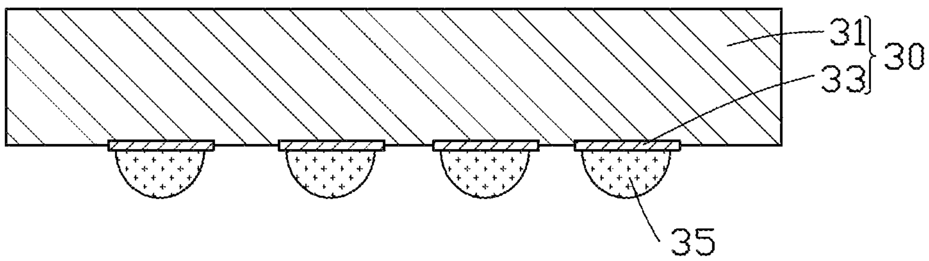
FIG. 7 is a cross-sectional view showing a second solder paste formed on each second pad of a chip according to the present disclosure.

In block 3, referring to FIG. 7, the chip 30 is provided. The chip 30 includes a body 31 and a plurality of second pads 33 disposed on a surface of the body 31. A second solder paste 35 is formed on each of the second pads 33.

Each second pad 33 corresponds to each first pad 13. That is, the second pads 33 can be disposed in a matrix, and two adjacent second pads 33 are spaced apart from each other. The second solder pastes 35 is disposed on the second pad 33, and two adjacent second solder pastes 35 are spaced apart from each other.

Figure 8:
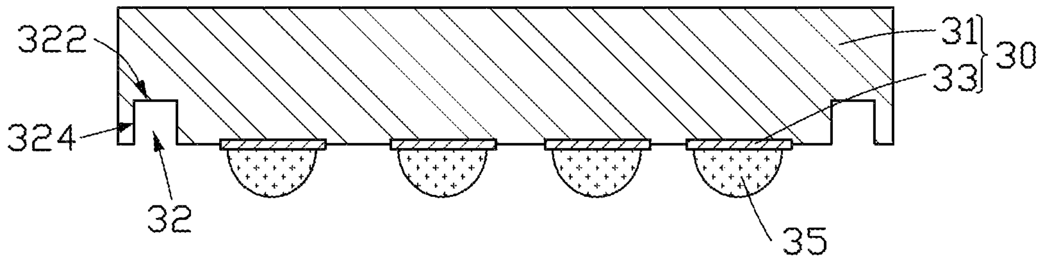
FIG. 8 is a cross-sectional view showing grooves defined on the chip of FIG. 7.

In block 4, referring to FIG. 8, at least one groove 32 is formed on the surface of the body 31 where the second pads 33 are disposed.

The groove 32 can be formed by laser. The groove 32 corresponds to the positioning post 20. The number of the groove(s) 32 is the same as the number of the positioning post(s) 20. The size of each groove 32 matches the size of the corresponding positioning post 20, so that the positioning post 20 can be accommodated in the groove 32.

In the embodiment, four grooves 32 are formed on the body 31, which are distributed at the corners of the chip 30. Each groove 32 has a bottom wall 322 and a sidewall 324. The sidewall 324 surrounds a periphery of the bottom wall 322. The bottom wall 322 is a bottom surface of the groove 32.

Figure 9:
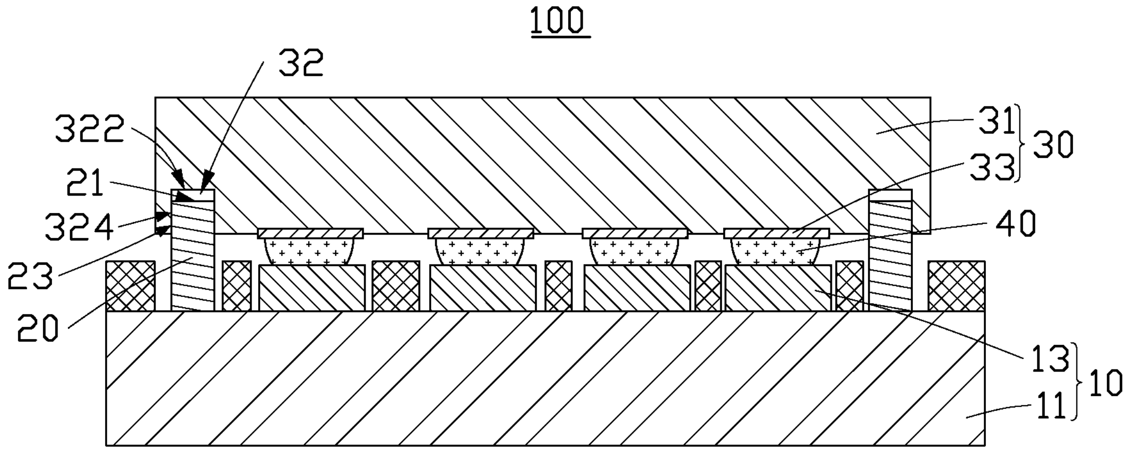
FIG. 9 is a cross-sectional view of a chip packaging structure formed by connecting the chip of FIG. 8 to the carrier of FIG. 6.

In block 5, referring to FIG. 9, one of the at least one positioning post 20 is accommodated in a corresponding one of the at least one groove 32, and each first solder paste 15 is connected to the second solder paste 35. The first solder paste 15 and the corresponding second solder paste 35 are melted and then solidified to form a solder ball 40. The solder ball 40 connect the chip 30 and the carrier 10, thereby forming a chip packaging structure 100.

One positioning post 20 is partially accommodated in the corresponding groove 32. Before the first solder pastes 15 and the second solder pastes 35 are melted, the top surface 21 of the positioning post 20 can be in contact with the bottom wall 322 of the groove 32, or can be spaced apart from the bottom wall 322 of the groove 32. At the time, both the first solder pastes 15 and the second solder pastes 35 are solid. When the first solder pastes 15 and the second solder pastes 35 are melted, the first solder pastes 15 and the second solder pastes 35 have fluidity and can be connected together. After the first solder pastes 15 and the second solder pastes 35 are solidified, each first solder paste 15 and the second solder paste 35 form one solder ball 40. Along a direction in which the chip 30 and the carrier 10 are stacked, a thickness of one solder ball 40 is less than a sum of a thicknesses of the first solder paste 15 and the corresponding second solder paste 35. After the solder balls 40 are formed, the top surface 21 of the positioning post 20 is spaced apart from the bottom wall 322 of the groove 32.

The positioning post 20 and the groove 32 can prevent the chip 30 from being deviated during the packaging process, thereby preventing a connection failure between the carrier 10 and the chip 30. In addition, the positioning post 20 can also play a heat dissipation role in the chip packaging structure 100, thereby improving the heat dissipation performance of the chip packaging structure 100.

In some embodiments, the side surface 23 of the positioning post 20 is connected to the sidewall 324 of the groove 32 to further play a limiting role. Furthermore, such connection can also increase the speed of heat transfer, and further improve the heat dissipation performance of the chip packaging structure 100.

Referring to FIG. 9, the chip packaging structure 100 according to an embodiment of the present disclosure. The chip packaging structure 100 includes the carrier 10, the positioning post 20, the chip 30, and the solder balls 40. At least one groove 32 is defined on the surface of the chip 30, the solder balls 40 are connected to the carrier 10, and one positioning post 20 is partially accommodated in the corresponding groove 32.

The carrier 10 includes the substrate 11 and first pads 13 disposed on the surface of the substrate 11. Two adjacent first pads 13 are spaced apart from each other.

The chip 30 includes the body 31 and the plurality of second pads 33 disposed on the surface of the body 31. Two adjacent second pads 33 are spaced apart from each other. Each second pad 33 is disposed corresponding to each first pad 13. That is, along the direction in which the chip 30 and the carrier 10 are stacked, a projection of each first pad 13 coincides with a projection of the corresponding second pad 33.

One solder ball 40 is disposed between each first pad 13 and the corresponding second pad 33 to achieve connection between the carrier 10 and the chip 30.

The positioning post 20 is disposed on the surface of the substrate 11 where the first pads 13 are disposed and extends toward the chip 30. The groove 32 is formed on the surface of the body 31 where the second pads 33 are disposed, and each positioning post 20 is partially accommodated in the groove 32.

Each positioning post 20 includes a top surface 21 and a side surface 23. The top surface 21 is a surface of the positioning post 20 facing away from the substrate 11. The side surface 23 connects the top surface 21 and the substrate 11. The top surface 21 is spaced apart from the bottom wall 322 of the groove 32. The side surface 23 is connected to the sidewall 324 of the groove 32, which can increase the speed of heat transfer and improve the heat dissipation performance.

In some embodiments, the positioning post 20 is made of copper.

The chip 30 is packaged by disposing positioning post 20 on the surface of the carrier 10, and the groove 32 matching the positioning post 20 is formed on the surface of the chip 30. During melting the first solder pastes 15 and the second solder pastes 35, due to the interaction between the positioning post 20 and the groove 32, the chip 30 will not be deflected due to the tension of the first solder pastes 15 and the second solder pastes 35, so that the chip packaging structure 100 meets the expected requirements.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for packaging a chip, comprising:

providing a carrier, the carrier comprising a substrate and a plurality of first pads disposed on a surface of the substrate;

forming a first solder paste on each of the plurality of first pads;

forming at least one positioning post on the surface of the substrate where the plurality of first pads is disposed, each of the at least one positioning post comprising a side surface connected to the substrate;

providing a chip, the chip comprising a body and a plurality of second pads disposed on a surface of the body;

forming a second solder paste on each of the plurality of second pads;

defining at least one groove on the surface of the body where the plurality of second pads is disposed;

accommodating one of the at least one positioning post in a corresponding one of the at least one groove, connecting the first solder paste to the second solder paste, and connecting the side surface to a sidewall of the groove; and melting and solidifying the first solder paste and the second soler paste to form a solder ball, thereby connecting the chip to the carrier to obtain the chip packaging structure;

wherein forming the at least one positioning post on the surface of the substrate comprises:

covering a dry film on the surface of the substrate where the plurality of first pads is disposed and the first solder paste;

defining at least one blind hole in the dry film to partially expose the surface of the substrate, the at least one blind hole corresponding to the at least one positioning post;

electroplating the at least one positioning post in a corresponding one of the at least one blind hole, thereby connecting each of the at least one positioning post to the substrate; and removing the dry film.

2. The method of claim 1, wherein one positioning post is formed, one blind hole is formed, the positioning post is non-cylindrical, and the blind hole is non-cylindrical.

3. The method of claim 1, wherein at least two positioning posts are formed, at least two blind holes are formed, each of the at least two positioning posts is cylindrical, and each of the at least two blind holes is cylindrical.

4. The method of claim 3, wherein four positioning posts are formed, four blind holes are formed.

5. The method of claim 1, wherein the at least one positioning post is made of copper.

6. The method of claim 1, wherein each of the at least one positioning post further comprises a top surface facing away from the substrate, and the side surface connects the top surface and the substrate.

* * * * *